USO09461457B2

(12) United States Patent
Fukuta et al.

(10) Patent No.: US 9,461,457 B2
(45) Date of Patent: Oct. 4, 2016

(54) DRIVER FOR TARGET SWITCHING ELEMENT AND CONTROL SYSTEM FOR MACHINE USING THE SAME

(71) Applicant: DENSO CORPORATION, Kariya, Aichi-pref. (JP)

(72) Inventors: Junichi Fukuta, Kuwana (JP); Yoshiyuki Hamanaka, Kariya (JP); Masatoshi Taguchi, Kariya (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 235 days.

(21) Appl. No.: 14/253,125

(22) Filed: Apr. 15, 2014

(65) Prior Publication Data

US 2014/0307495 A1 Oct. 16, 2014

(30) Foreign Application Priority Data

Apr. 15, 2013 (JP) .................................. 2013-085238

(51) Int. Cl.
| | | |
|---|---|---|
| *H02M 7/5387* | (2007.01) | |
| *H02H 3/08* | (2006.01) | |
| *H03K 17/082* | (2006.01) | |
| *H03K 17/16* | (2006.01) | |

(52) U.S. Cl.
CPC ............. *H02H 3/08* (2013.01); *H02M 7/5387* (2013.01); *H03K 17/0828* (2013.01); *H03K 17/165* (2013.01); *H03K 17/168* (2013.01); *H03K 2217/0081* (2013.01)

(58) Field of Classification Search
CPC .......... H02M 7/5387; H02M 7/53871; H03K 17/0828; H03K 17/165; H03K 7/168; H03K 2217/0081; H02H 3/08
See application file for complete search history.

(56) References Cited

U.S. PATENT DOCUMENTS

| 5,210,479 A | 5/1993 | Kimura |
|---|---|---|
| 5,383,082 A | 1/1995 | Nishizawa |
| 7,579,880 B2 * | 8/2009 | Ueda ................ H03K 17/04123 326/83 |
| 7,710,187 B2 * | 5/2010 | Hiyama ............... H03K 17/168 326/21 |
| 2004/0252435 A1 | 12/2004 | Ishikawa et al. |

(Continued)

FOREIGN PATENT DOCUMENTS

| JP | 02-50518 | 2/1990 |
|---|---|---|
| JP | 04-337919 | 11/1992 |

(Continued)

OTHER PUBLICATIONS

Office Action (1 page) dated Mar. 17, 2015, issued in corresponding Japanese Application No. 2013-085238 and English translation (2 pages).

*Primary Examiner* — Matthew Nguyen
(74) *Attorney, Agent, or Firm* — Nixon & Vanderhye P.C.

(57) ABSTRACT

In a driver having a reference point with a reference potential for driving a target switching element having an on-off control terminal, a charging path electrically connects the on-off control terminal of the target switching element and a driving power source for charging the on-off control terminal of the target switching element. A bypass path electrically connects the on-off control terminal of the target switching element and the driving power source. A storage has a first conductive end electrically connected to the bypass path and a second conductive end electrically connected to the reference point of the target switching element, and is configured for storing therein charge sent through the bypass path.

7 Claims, 10 Drawing Sheets

(56) References Cited

U.S. PATENT DOCUMENTS

| | | |
|---|---|---|
| 2007/0030615 A1 | 2/2007 | Ishikawa et al. |
| 2008/0123382 A1 | 5/2008 | Matsushita |
| 2009/0128974 A1 | 5/2009 | Ishikawa et al. |
| 2012/0126859 A1* | 5/2012 | Kawamoto .......... H03K 17/163 327/108 |
| 2012/0242376 A1* | 9/2012 | Ose ....................... H03K 17/14 327/109 |

FOREIGN PATENT DOCUMENTS

| | | |
|---|---|---|
| JP | 05-218836 | 8/1993 |
| JP | 2005-006381 | 1/2005 |
| JP | 2008-017558 | 1/2008 |
| JP | 2008-211721 | 9/2008 |
| JP | 2012-100489 | 5/2012 |

* cited by examiner

DRIVER FOR TARGET SWITCHING ELEMENT AND CONTROL SYSTEM FOR MACHINE USING THE SAME

CROSS REFERENCE TO RELATED APPLICATIONS

This application is based on and claims the benefit of priority from Japanese Patent Application 2013-085238 filed on Apr. 15, 2013, the disclosure of which is incorporated in its entirety herein by reference.

TECHNICAL FIELD

The present disclosure relates to drivers for driving a target switching element.

BACKGROUND

There are known drivers applied for power converters that are equipped with series-connected upper- and lower-arm switching elements, such as IGBTs, connected in parallel to a direct-current power source. The upper- and lower-arm switching elements are also known as high- and low-side switching elements. In such a power converter, while there is a short-circuit fault in one of the upper- and lower-arm switching elements, turn-on of the other thereof causes the upper- and lower-arm switching elements to be short-circuited, which causes an overcurrent to flow through the upper- and lower-arm switching elements.

Technologies for protecting an IGBT as an example of switching elements against such an overcurrent are known, one of which is disclosed in Japanese Patent Application Publication No. H05-218836. A driver disclosed in the Patent Publication is equipped with an overcurrent protection circuit. Specifically, the driver is equipped with a series connection comprised of a bipolar transistor and a Zener diode connected in series to each other, and the series connection is connected between the gate and emitter of the IGBT. The bipolar transistor is switched from an off state to an on state when it is determined that an overcurrent is flowing through the IGBT. The turn-on of the switching element limits the gate voltage of the IGBT to a predetermined Zener voltage of the Zener diode, thus reducing the gate voltage of the IGBT. This suppresses the overcurrent flowing through the IGBT.

SUMMARY

The inventors of this application have found that, while one of the upper- and lower-arm switching elements is in a fully on state, i.e. a completely on state, a short-circuit fault of the other thereof may make it difficult to suppress an overcurrent flowing through the upper- and lower-arm switching elements, resulting in reduction of the reliability of the upper- and lower-arm switching elements. For example, a short-circuit fault in the upper-arm switching element with the lower-arm switching element being in the on state may result in flow of a short-circuit current between the upper- and lower-arm switching elements, increasing the collector-emitter voltage of the lower-arm switching element. This may result in flow of a current from the collector of the lower-arm switching element into the gate thereof via a feedback capacitance between the gate and collector of the lower-arm switching element, increasing the gate voltage of the lower-arm switching element. This increase of the gate voltage of the lower-arm switching element may further increase an overcurrent flowing through the upper- and lower-arm switching elements, resulting in reduction of the reliability of the upper- and lower-arm switching elements.

In view of the circumstances set forth above, one aspect of the present disclosure seeks to provide drivers for a switching element, which are designed to address the problems set forth above.

Specifically, an alternative aspect of the present disclosure aims to provide such drivers, which are capable of preventing reduction of the reliability of a target switching element even while an overcurrent is flowing through the target switching element.

According to a first exemplary aspect of the present disclosure, there is provided a driver having a reference point with a reference voltage for driving a target switching element having an on-off control terminal. The driver includes a charging path, connecting the on-off control terminal of the target switching element and a driving power source, for charging the on-off control terminal of the target switching element, and a bypass path connecting the on-off control terminal of the target switching element and the driving power source. The driver includes a storage having a first conductive end electrically connected to the bypass path and a second conductive end electrically connected to the reference point of the target switching element and configured for storing therein charge sent through the bypass path.

According to a second exemplary aspect of the present disclosure, there is provided a control system for controlling a machine. The control system includes a power conversion device equipped with a series connection electrically connected in parallel to a DC power source. The series connection comprises a high-side switching element and a low-side switching element electrically connected in series thereto. Each of the high- and low-side switching elements has an on-off control terminal and a reference point with a reference potential. The control system includes a driver having a reference point with a reference potential and provided for each of the high- and low-side switching elements. The driver for each of the high- and low-side switching elements is configured for driving a corresponding one of the high- and low-side switching elements to thereby cause the power conversion device to perform power conversion of DC power output from the DC power source. The driver includes a charging path, electrically connecting the on-off control terminal of a corresponding one of the high- and low-side switching elements and a driving power source, for charging the on-off control terminal of a corresponding one of the high- and low-side switching elements. The driver includes a bypass path electrically connecting the on-off control terminal of a corresponding one of the high- and low-side switching elements and the driving power source. The driver includes a storage having a first conductive end electrically connected to the bypass path and a second conductive end electrically connected to the reference point of the target switching element and configured for storing therein charge sent through the bypass path.

In each of the first and second exemplary aspects, the driver is equipped with the bypass path and the storage. Even if a current flows into the on-off control terminal while the target switching element (the corresponding high- or low-side switching element) is in the full on state and an overcurrent flows through the target switching element, the bypass path causes the current flowing into the on-off control terminal to be guided therethrough into the storage. This suppresses an increase of the voltage at the on-off control terminal while an overcurrent is flowing through the target switching element. Thus, it is possible to limit an overcurrent flowing through the target switching element, thus preventing a reduction of the reliability of the target switching element.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

Figure 1:
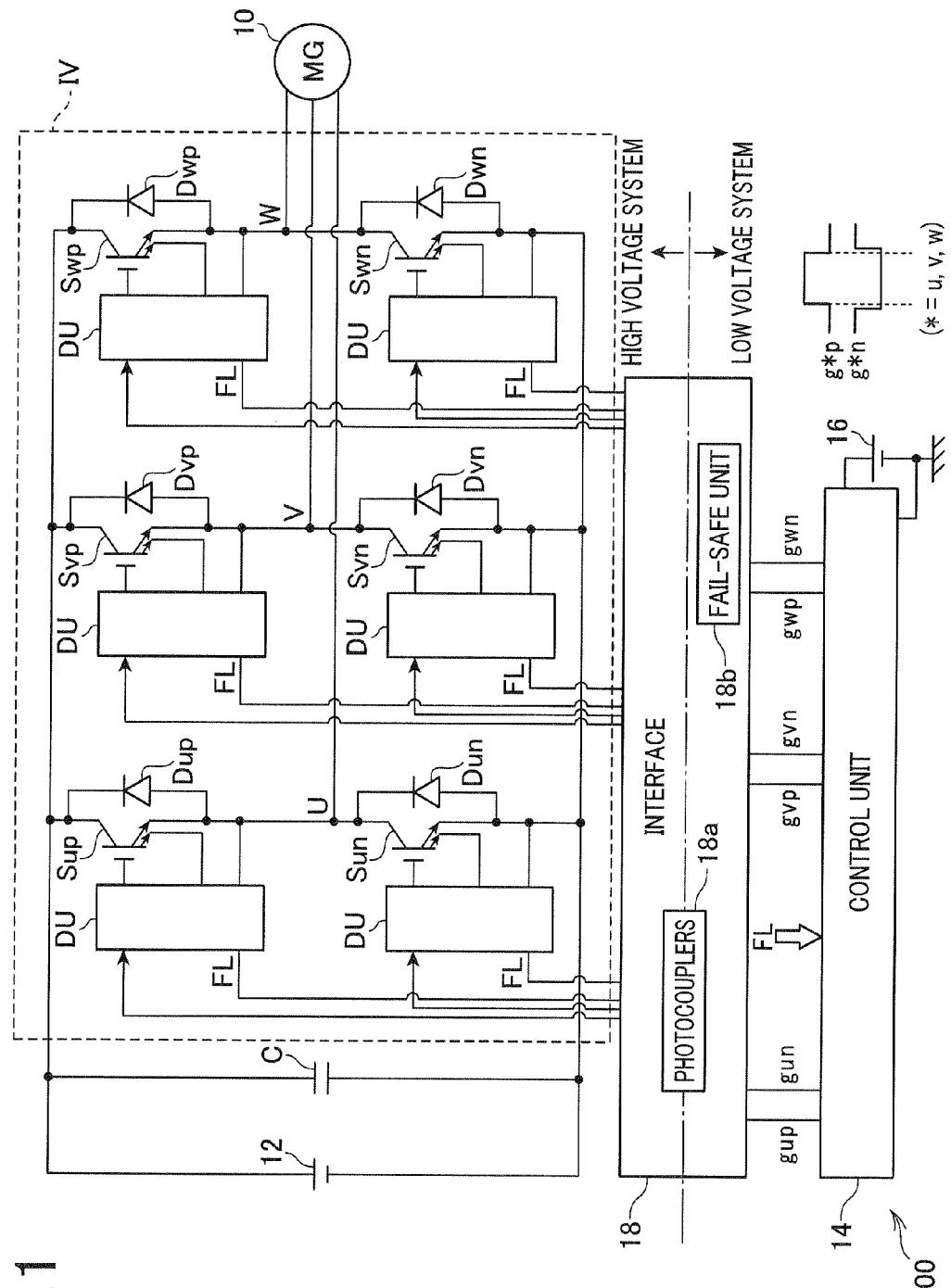
FIG. 1 is a view schematically illustrating an overall configuration of a control system for a motor-generator according to a first embodiment of the present disclosure.

Embodiments of the present disclosure will be described hereinafter with reference to the accompanying drawings. In the embodiments, like parts between the embodiments, to which like reference characters are assigned, are omitted or simplified in description to avoid redundant description.

First Embodiment

Referring to FIG. 1, there is illustrated a three-phase motor-generator as an example of rotating machines, referred to simply as a "motor-generator" 10, installed in, for example, a hybrid vehicle equipped with an internal combustion engine as a main engine according to a first embodiment. The motor-generator 10 is mechanically coupled to driving wheels (not shown) of the hybrid vehicle.

The motor-generator 10 is comprised of, for example, a rotor including a magnetic field and a stator including three-phase windings, i.e. U-, V-, and W-phase windings. The rotor of the motor-generator 10 is rotated based on magnetic interaction between the magnetic field of the rotor and a rotating field generated by the three-phase windings when the three-phase windings are energized. For example, the three-phase windings (U-, V-, and W-phase windings) each have one end connected to a common junction (neutral point) and the other end to a separate terminal in, for example, a star-configuration.

In FIG. 1, there is also illustrated a control system 100 for controlling the motor-generator 10. The control system 100 is equipped with an inverter IV, a capacitor C, a high-voltage battery 12 serving as a DC power source, drive units DU serving as, for example drivers, a control unit 14, a low-voltage battery 16, and an interface 18.

To the motor-generator 10, the high-voltage battery 12 is electrically connected via the capacitor C and the inverter IV. The high-voltage battery 12 has a terminal voltage, which is equal to or higher than 100 V, thereacross.

The capacitor C is connected in parallel to the high-voltage battery 12 and to the inverter IV. The capacitor C is operative to smooth the terminal voltage across the high-voltage battery 12.

The inverter IV is designed as a three-phase inverter. The inverter IV is provided with three series connections, each of which consists of series-connected high- and low-side (upper- and lower-arm) switching elements. Specifically, the inverter IV is provided with three pairs of series-connected high- and low-side switching elements S*# (*=u, v, w, #=p, n), i.e, Sup and Sun, Svp and Svn, and Swp and Swn.

The inverter IV is also provided with flywheel diodes Dup and Dun, Dvp and Dvn, and Dwp and Dwn electrically connected in antiparallel to the corresponding switching elements Sup and Sun, Svp and Svn, and Swp and Swn, respectively.

In the first embodiment, as the switching elements S*# (*=u, v, w, #=p, n), IGBTs are respectively used.

When power MOSFETs are used as the switching elements S*# (*=u, v, w, #=p, n), intrinsic diodes of the power MOSFETs can be used as the flywheel diodes, thus eliminating the flywheel diodes.

The three pairs of switching elements are parallelly connected to each other in bridge configuration. A connecting point through which each of the switching elements S*p is connected to a corresponding one of the elements S*n in series is connected to a corresponding one of the U-phase winding, V-phase winding, and W-phase winding. One end of the series-connected switching elements of each of the three pairs, such as the collector of the corresponding high-side switching element, is connected to the positive terminal of the high-voltage battery 12 via the positive DC input line. The other end of the series-connected switching elements of each of the three pairs, such as the emitter of the corresponding low-side switching element, is connected to the negative terminal of the high-voltage battery 12 via the negative DC input line. In the first embodiment, a switching element S*# serves as, for example, a target switching element.

For example, the control unit 14 is comprised of a microcomputer as its main component, and operates based on a power-supply voltage, lower than the terminal voltage across the high-voltage battery 12, supplied from the low-voltage battery 16. Thus, the control unit 14 and the low-voltage battery 16 constitute a low voltage system. In contrast, the motor-generator 10, the inverter IV, and the high-voltage battery 12 constitute a high voltage system.

The interface 18 is provided with insulation members, such as photocouplers 18a, provided for the respective switching elements S*# of the inverter IV. The photocouplers 18a are configured to enable communications between the high and low voltage systems while establishing electrical insulation therebetween. Specifically, the photocouplers 18a are configured to enable the control unit 14 to control a corresponding one of the switching elements S*# while establishing electrical insulation between the control unit 14 and a corresponding one of the switching elements S*#.

The control unit 14 is designed to drive the inverter IV to thereby control a controlled variable of the motor-generator 10, such as an output torque of the motor-generator 10.

Specifically, the control unit 14 is designed to individually send drive signals g*# to the drive units DU provided for the respective switching elements S*#, thus individually turning on or off the respective switching elements S*#. The individual turn-on or off of the respective switching elements S*# convert the output DC voltage across the capacitor C into an AC voltage, and supply the AC voltage to the motor-generator 10.

Each of the drive signals g*# has a predetermined duty cycle, i.e. a predetermined ratio of on duration to the total duration of each switching cycle for a corresponding one of the switching elements S*# (see FIG. 1).

Specifically, the control unit 14 is designed to complementarily turn on the high- and low-side switching elements S*# for each leg (phase) via the corresponding drive units DU according to the corresponding drive signals g*#. In other words, the control unit 14 is designed to alternately turn on the high-side switching element S*p of one leg (phase) and the low-side switching element S*n of the same leg (phase). This drive alternately closes the conductive path between the collector and emitter of the high-side switching element S*p of one leg and the conductive path between the collector and emitter of the high-side switching element S*n of the same leg.

To each drive unit DU for driving a corresponding switching element S*#, an isolated switching power source PS (see FIG. 2) is provided to supply power, which is not illustrated in FIG. 1 for the sake of simple illustration of the inverter IV. The isolated switching power source PS serves as, for example, a driving power source.

In the first embodiment, the isolated switching power source PS is provided with transformers TW for the drive units DU of the respective U-, V-, and W-phase upper-arm switching elements S*p. The transformers TW are operative to supply power from the low-voltage battery 16 to the respective drive units DU of the respective U-, V-, and W-phase upper-arm switching elements S*p therethrough. In contrast, for only the drive unit DU of one of the U-, V-, and W-phase lower-arm switching elements S*n, the transformer TW is provided to supply power from the low-voltage battery 16 to the drive units DU of the respective U-, V-, and W-phase lower-arm switching elements S*n via the transformer TW.

Next, an example of the circuit structure of the isolated switching power source PS and that of each drive unit DU provided for a corresponding one switching element S*# will be described with reference to FIG. 2.

Figure 2:
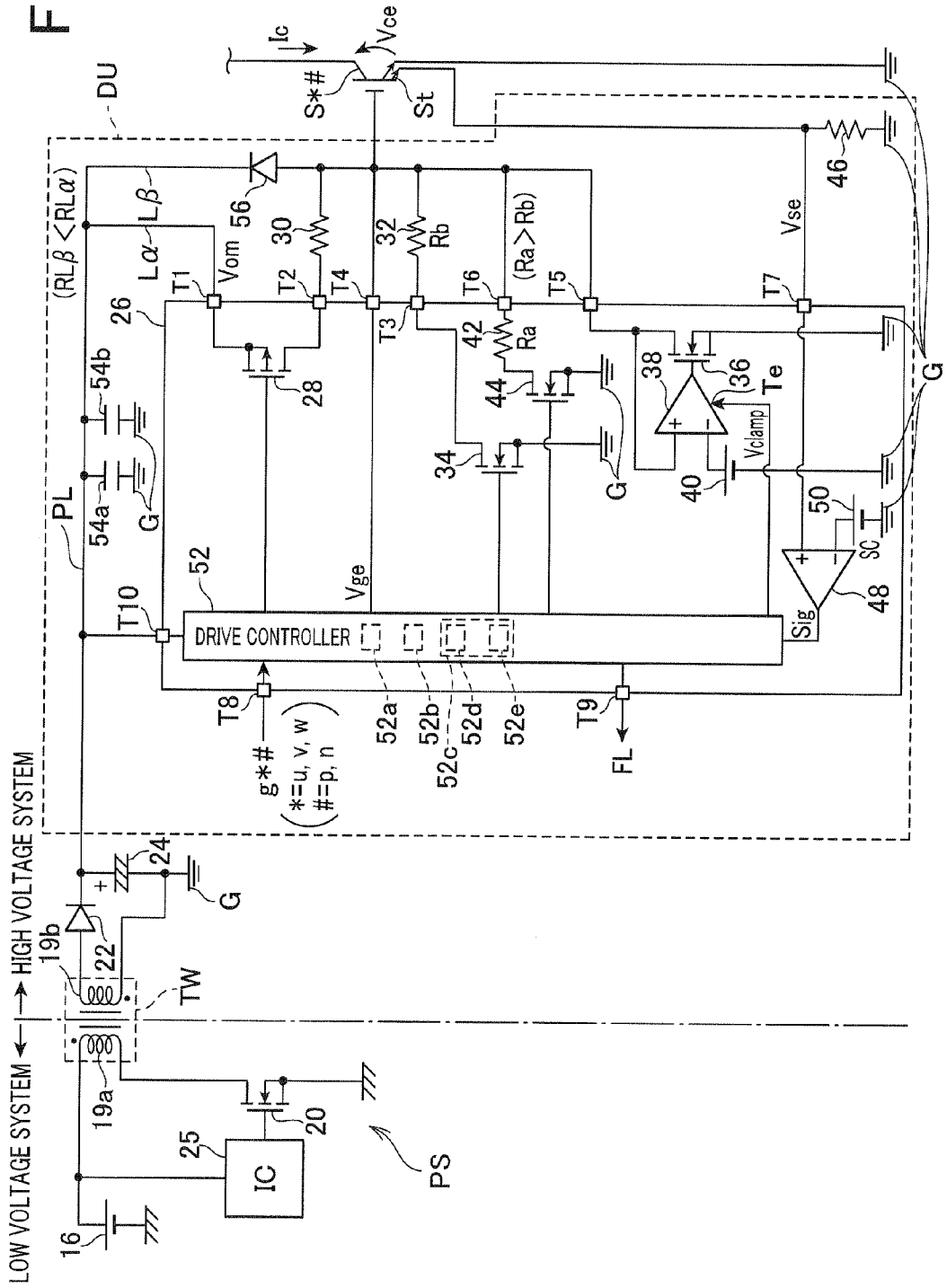
FIG. 2 is a circuit diagram schematically illustrating an example of the structure of each drive unit of the control system illustrated in FIG. 1.

Referring to FIG. 2, the isolated switching power source PS is designed as a flyback switching power source comprised of the transformer TW, a voltage-control switching element 20, a diode 22 for power sources, a capacitor 24, and an IC 25 for power sources. As the voltage-control switching element 20, an N-channel MOSFET is for example used.

The transformer TW is comprised of a pair of insulated primary winding 19a and secondary winding 19b. Both terminals of the low-voltage battery 16 are connected to each other via the primary winding 19a and the voltage-control switching element 20. Specifically, the positive terminal of the low-voltage battery 16 is connected to a first end of the primary winding 19a, and a second end of the primary winding 18a, which is opposite to the first end thereof, is connected to the drain of the voltage-control switching element 20. The source of the voltage-control switching element 20 is connected to the negative terminal of the low-voltage battery 16. The gate of the voltage-control switching element 20 is connected to the IC 25.

Both ends of the secondary coil 19b are connected to each other via series-connected diode 22 and capacitor 24. Specifically, a first end of the secondary winding 18b is connected to the anode of the diode 22, and the cathode thereof is connected to a first conductive end, such as a first electrode, of the capacitor 24. A second conductive end, such as a second electrode, of the capacitor 24, which is opposite to the first conductive end thereof, is connected to a second end of the secondary winding 19b, which is opposite to the first end thereof. The connection point between the second end of the secondary winding 19b and the second conductive end of the capacitor 24 is connected to, for example, a common potential terminal that is connected to an output terminal, i.e. the emitter, of the switching element S*#. In this embodiment, the potential at the emitter of the switching element S*# is set to 0 V, that is, the common potential terminal is, for example, a ground terminal G serving as, for example, a reference point. The connection point between the cathode of the diode 22 and the first conductive end of the capacitor 24, which serves as an output of the isolated switching power source PS, is electrically connected to a first terminal T1 of a drive IC 26 installed in the drive unit DU described later.

The voltage-control switching element 20 is configured to be turned on or off under control of the IC 25. Specifically, the IC 25 is operative to turn on or off the voltage-control switching element 20 so that an output voltage of the isolated switching power source PS to be input to the drive unit DU should be regulated to a target voltage of, for example, 15 V.

The drive unit DU is comprised of the drive IC 26, a first capacitor 54a, a second capacitor 54b, a charging resistor 30, a discharging resistor 32, a sense resistor 46, and a diode 56.

The drive IC 20 is designed as, for example, a single semiconductor IC on a chip. The drive IC 20 has first to tenth terminals T1 to T10, a charging switching element (SW) 28, a discharging switching element (SW) 34, a clamping switching element (SW) 36, a clamping operational amplifier 38, and a first power source, i.e. a first DC power source, 40. The drive IC 20 also has soft-turnoff resistor 42, a soft-turnoff switching element (SW) 44, a comparator 48, a second power source, i.e. a second DC power source, 50, and a drive controller 52. As the charging switching element 28, a P-channel MOSFET is used. In contrast, as each of the discharging switching element 34, the clamping switching element 36, and the soft-turnoff switching element 44, an N-channel MOSFET is used.

The output voltage of the isolated switching power source PS is supplied to the first terminal T1 of the drive IC 26. Thus, at the first terminal T1 of the drive IC 26, a predetermined voltage Vom, which corresponds to the target voltage of, for example, 15 V, is maintained. The first terminal T1 is electrically connected to the source of the charging switching element 28, and the gate thereof is electrically connected to the drive controller 52. The second terminal T2 is connected to the drain of the charging switching element 28, and to the on-off control terminal, i.e. the gate, of the switching element S*# via the charging resistor 30.

The gate of the switching element S*# is electrically connected to the third terminal T3 via the discharging resistor 32, and the third terminal T3 is electrically connected to the drain of the discharging switching element 34. The on-off control terminal, i.e. the gate, of the discharging switching element 34 is electrically connected to the drive controller 52, and the source thereof is electrically connected to the emitter of the switching element S*# via the common potential terminal G.

Specifically, in the first embodiment, an electrical path defined from the output of the isolated switching power source PS, i.e. the connection point between the cathode of the diode 22 and the first conductive end of the capacitor 24, to the gate of the switching element S*# via the first terminal T1, the charging switching element 28, the second terminal T2, and the charging resistor 30 will be referred to as a charging path La.

The gate of the switching element S*# is electrically connected to the drive controller 52 via the fourth terminal T4. The clamping operational amplifier 38 has a non-inverting input terminal, an inverting input terminal, and an output terminal. The gate of the switching element S*# is also electrically connected to the fifth terminal T5, and the fifth terminal T5 is electrically connected to both the non-inverting input terminal of the clamping operational amplifier 38 and the drain of the clamping switching element 36. The source of the clamping switching element 36 is electrically connected to the source of the switching element S*# via the common potential terminal G.

The inverting input terminal of the clamping operational amplifier 38 is electrically connected to the positive electrode of the first DC power source 40, and the negative electrode of the first DC power source 40 is electrically connected to the source of the switching element S*# via the common potential terminal G.

The clamping operational amplifier 38 has an enable terminal Te electrically connected to the drive controller 52. As described later, while an enable signal is input to the enable terminal Te of the clamping operational amplifier 38 from the drive controller 52, the clamping operational amplifier 38 is activated.

The first DC power source 40 has an output voltage, referred to as a clamp voltage $V_{clamp}$, determined to limit the voltage applied to the on-off control terminal of the switching element S*#, i.e. the gate voltage Vge, from exceeding a predetermined value. The predetermined value is determined to prevent a current, whose value may excessively reduce the reliability of the switching element S*#, from flowing through the switching element S*#. For example, the limited value for the gate voltage Vge is set to 12.5 V.

Specifically, in the first embodiment, the clamp voltage $V_{clamp}$ is set to be equal to or higher than a threshold voltage Vth of the switching element S*#, and to be lower than the output voltage of the isolated switching power source PS, i.e. the voltage Vom at the first terminal T1.

Moreover, the gate of the switching element S*# is electrically connected to a first end of the soft-turnoff resistor 42, and a second end of the soft-turnoff resistor 42, which is opposite to the first end thereof, is electrically connected to the sixth terminal T6. The sixth terminal T6 is electrically connected to the drain of the soft-turnoff switching element 44, and the source of the soft-turnoff switching element 44 is connected to the emitter of the switching element S*# via the common potential terminal G. The gate of the soft-turnoff switching element 44 is connected to the drive controller 52. In other words, the gate of the switching element S*# is connected to the emitter thereof via the sixth terminal T6, the soft-turnoff resistor 42, and the soft-turnoff switching element 44.

The switching element S*# has a sense terminal St for outputting a minute current, i.e. a sense current, associated with a current, i.e. a collector current Ic, flowing through the conductive path between an input terminal and an output terminal thereof, i.e. between the collector and the emitter thereof. For example, the magnitude of the minute current is 0.01% of that of the collector current Ic.

The sense terminal St is electrically connected to a first end of the resistor, that is, the sense resistor, 46 and a second end of the sense resistor 46, which is opposite to the first end thereof, is electrically connected to the emitter of the switching element S*# via the common potential terminal G.

When the collector current Ic flows through the conductive path of the switching element S*#, the sense current correlated with the collector current Ic flows through the sense resistor 46, so that a voltage drop across the sense resistor 46 occurs. Thus, it is possible to obtain the voltage drop across the sense resistor 46 as a sense voltage Vse at the first end of the sense resistor 46 connected to the sense terminal St; the sense voltage Vse is a parameter correlated with an electric state quantity of the magnitude of the collector current Ic flowing through the switching element S*#. That is, the level of the sense voltage Vse is as a function of, i.e. correlates with, the magnitude of the collector current Ic flowing through the switching element S*#.

In the first embodiment, the positive polarity of sense voltage Vse is defined when the potential at the first end of the sense resistor 46 connected to the sense terminal St is higher than the potential at the emitter of the switching element S*#. As described above, the potential at the emitter of the switching element S*# is set to be zero volts. In the first embodiment, the sense terminal St and the sense resistor 46 serve as, for example, a measuring unit.

The comparator 48 has a non-inverting input terminal, an inverting input terminal, and an output terminal. The sense terminal St is electrically connected to the non-inverting input terminal of the comparator 48 via the seventh terminal T7. The inverting input terminal of the comparator 48 is connected to the positive electrode of the second DC power source 50, and the negative electrode of the second DC power source 50 is electrically connected to, for example, the common potential terminal G. The output terminal of the comparator 48 is electrically connected to the drive controller 52. In the first embodiment, the second DC power source 50 has an output voltage, referred to as a short-circuit threshold voltage, SC. The output voltage, i.e. the short-circuit threshold voltage, SC is set to a level of the sense voltage Vse; the level of the sense voltage Vse is associated with a level of the collector current Ic flowing through the switching element S*# when there is an upper-lower arm short-circuit. An output signal Sig of the comparator 48 is input to the drive controller 52. Specifically, the output signal Sig of the comparator 48 has a logical high level when the level of the sense voltage Vse is equal to or higher than the short-circuit threshold voltage SC, and has a logical low level when the level of the sense voltage Vse is lower than the short-circuit threshold voltage SC. In other words, the output signal Sig of the comparator 48 has the logical high level when the level of the collector current Ic corresponding to the level of the sense voltage Vse is equal to or higher than a preset current level corresponding to the short-circuit threshold voltage SC, and has the logical low level when the level of the collector current Ic is lower than the preset current level. In the first embodiment, the soft turn-off resistor 42, the soft turn-off switching element 44, the comparator 48, the second DC power source 50, and the drive controller 52 serve as, for example, a forcible turn-off unit.

Note that the upper-lower arm short-circuit used for setting the short-circuit threshold voltage SC means that, while there is a short-circuit fault in one of the high- and low-side switching elements S*p and S*n of a same phase, switching the other thereof from the off state to the on state causes both the high- and low-side switching elements S*p and S*n of the same phase to be in the on state, thus producing a conductive path of an overcurrent, i.e. a short-circuit current, for the pair of high- and low-side switching elements S*# of the same phase. That is, the conductive path of an overcurrent for the upper-lower arm short-circuit is established between a high-side switching element S*p of one phase and a low-side switching element S*n of the same phase without passing through the motor-generator 10, i.e. the load. The upper-lower arm short-circuit will also be referred to as a first type upper-lower arm short-circuit.

The output of the isolated switching power source PS, i.e. the connection point between the cathode of the diode 22 and the first conductive end of the capacitor 24, is also electrically connected to the gate of the switching element S*# via a bypass path Lβ and the diode 56. The bypass path Lβ is configured to be short-circuited to the emitter of the switching element S*# via each of the first and second capacitors 54a and 54b and the common potential terminal G. That is, as described above, the charging path Lα and the bypass path Lβ are electrically connected to the output of the isolated switching power source PS via a common power supply line PL. A multilayer ceramic capacitor can be used as each of the first and second capacitors 54a and 54b.

The diode 56, serving as, for example, an electrical connection device, is provided on a portion of the bypass path Lβ; the portion is located between a point to which a first conductive end of each of the first and second capacitors 54a and 54b is electrically connected and the gate of the switching element S*#. Specifically, the anode of the diode 56 is electrically connected to the gate of the switching element S*# via a corresponding portion of the bypass path Lβ, and the cathode of the diode 56 is electrically connected to the point of the bypass path Lβ to which the first conductive end of each of the first and second capacitors 54a and 54b is electrically connected. A second conductive end of each of the first and second capacitors 54a and 54b, which is opposite to the first conductive end thereof, is electrically connected to the source of the emitter of the switching element S*# via the common potential terminal G. Each of the first and second capacitors 54a and 54b serves as, for example, a storage for storing therein charge sent through the bypass path Lβ.

In the first embodiment, as described above, the charging resistor 30 is provided on the charging path Lα. For this reason, the bypass path Lβ has an impedance RLβ lower than an impedance RLα of the charging path Lα.

The drive controller 52 is operative to receive the drive signal g*# via the interface 18 and the eight terminal T8, and alternately perform, based on the drive signal g*#, a charging task for the gate of the switching element S*# and a discharging task for the gate thereof.

Note that, in the first embodiment, the drive signal g*# output from the control unit 14 represents:
an on command to shift the switching element S*# to be the on state when it has the high level (H); and
an off command to shift the switching element S*# to be in the off state when it has the low level (L).

Specifically, the drive controller 52 functionally includes a charging unit 52a and a discharging unit 52b.

When the drive signal g*# is changed to the on command, i.e. the high level, the charging unit 52a turns on the charging switching element 28 and turns off the discharging switching element 34. This closes the charging path Lα and opens a discharging path defined between the gate and source of the switching element S*# via the discharging resistor 32 and the discharging switching element 34.

This charges the gate of the switching element S*# based on the voltage Vom at the first terminal T1 through the charging path Lα including the charging switching element 28 and the charging resistor 30.

When the drive signal g*# input to the drive controller 52 is changed from the high level to the low level showing the off command, the discharging unit 52b turns on the discharging switching element 34 and turns off the charging switching element 28. This discharges the gate of the switching element S*# through the discharging switching element 34 via the discharging path, thus changing the switching element S*# from the on state to the off state.

The drive controller 52 also functionally includes an overcurrent-protecting unit 52c. The overcurrent-protecting unit 52c is operative to perform an overcurrent protection task based on the gate voltage Vge input thereto via the terminal T4, the output signal Sig of the comparator 48 input thereto, and the like. The overcurrent protection task includes a clamping task and a soft turn-off task. Specifically, the overcurrent-protecting unit 52c functionally includes a clamping unit, in other words, a limiting unit, 52d and a soft-turnoff unit 52e.

First, let us describe the clamping task carried out by the clamping unit 52d.

The clamping task is designed to have output the enable signal to the enable terminal Te of the clamping operational amplifier 38 for a predetermined time interval $T_{clamp}$, such as a fixed time, since the gate voltage Vge reached a predetermined voltage Vα while the gate of the switching element S*# is charged in response to the on command of the drive signal g*#. The predetermined voltage Vα is set to be lower than a Miller voltage. The Miller voltage means a substantially constant level at which the gate voltage Vge remains while the drain voltage rises or falls during the charging task or discharging task of the switching element S*#. The enable signal output to the enable terminal Te of the clamping operational amplifier 38 turns on the clamping switching element 36. For example, the predetermined time interval $T_{clamp}$ will be referred to as clamp-filter time $T_{clamp}$.

That is, the clamping task is designed to limit an increase of the gate voltage Vge with respect to the clamp voltage $V_{clamp}$ before the arrival of the gate voltage Vge at the voltage Vom at the first terminal T1 while the gate of the switching element S*# is charged in response to the on command of the drive signal g*#.

The clamping task restricts, when there is a first type upper-lower arm short-circuit, the collector current Ic flowing through the switching element S*# until the switching element S*# is switched to the off state by the soft-turnoff task described later.

For example, when there is a first tpe upper-lower arm short-circuit, the clamp-filter time $T_{clamp}$ according to the first embodiment is set to be slightly longer than the sum of:

a maximum value of time required from the timing when the gate voltage Vge reaches the predetermined voltage Vα to the timing when the gate voltage Vge exceeds the short-circuit threshold voltage SC; and a short-circuit filter time Tsc used by the soft-turnoff task described later.

Next, let us describe the soft-turnoff task carried out by the soft-turnoff unit 52e.

Note that, in the first embodiment, the soft-turnoff resistor 42 has a resistance Ra, the discharging resistor 32 has a resistance Rb, and the resistance Ra is higher than the resistance Rb.

The soft-turnoff task is designed to turn off the charging and discharging switching elements 28 and 38, and turn on the soft-turnoff switching element 44 when it is determined that the logical level of the output signal Sig of the comparator 48 has been continuously maintained at the logical high level for the predetermined short-circuit filter time Tsc. The soft-turnoff task discharges the gate of the switching element S*# via the soft-turnoff switching element 44 and the soft-turnoff resistor 42, thus forcibly turning off the switching element S*# slower than turnoff of the switching element S*# through the discharging switching element 34 and discharging resistor 32.

The short-circuit filter time Tsc serves as means for preventing erroneous execution of the soft-turnoff task due to instantaneous increase of the level of the output signal Sig of the comparator 48 when noise is contained in the output signal Sig.

As described above, the resistance Ra of the soft-turnoff resistor 42 is higher than the resistance Rb of the discharging resistor 32, so that the resistance of the discharge path of the gate of the switching element S*# via the soft-turnoff switching element 44 and resistor 42 is higher than that of the discharge path of the gate of the switching element S*# via the discharging switching element 34 and resistor 32.

If the switching speed of the switching element S*# from the on state to the off state were high while the collector current Ic having an excessively high value flows through the switching element S*# as an overcurrent, there might be an excessively high surge voltage produced due to the high-speed shutdown of the switching element S*#. Thus, in this situation, the soft-turnoff task forcibly changes the resistance of the discharge path of the gate of the switching element S*# via the soft-turnoff resistor 42 to be higher than that of discharge path of the gate of the switching element S*# via the discharging resistor 32 in normal situations. This suppresses the magnitude of a surge produced due to the turn-off of the switching element S*#.

When executing the soft-turnoff task, the soft-turnoff unit 52e of the drive controller 52 executes a task to output a fail-safe signal FL and a task to disable the drive of each of the charging and discharging switching elements 28 and 34.

The fail-safe signal FL represents an abnormal state in the operation of the switching element S*#, and is output to the low-voltage system, i.e. the controller 14, via the terminal T9 and the interface 18.

There is another type of upper-lower arm short-circuit, which occurs due to the following situation that is different from the situation causing the first type upper-lower arm short-circuit set forth above. Specifically, while one of the upper- and lower-arm switching elements S*p and S*n is in a fully on state, i.e. a completely on state, there is a short-circuit fault of the other thereof, thus producing a conductive path of an overcurrent, i.e. a short-circuit current, for the upper- and lower-arm switching elements S*p and S*n. The upper-lower arm short-circuit will also be referred to as a second type upper-lower arm short-circuit.

Note that the full on state of a switching element S*# means that the gate voltage Vge is sufficiently higher than the threshold voltage Vth thereof. Specifically, the full on state of a switching element S*# means that the gate voltage Vge is higher than the clamp voltage $V_{clamp}$. Particularly, in the first embodiment, the full on state of a switching element S*# means a state in which the gate voltage of the switching element S*# is close to the output voltage of the isolated switching power source PS, i.e. the voltage Vom at the first terminal T1, or a state in which the gate voltage Vge is equal to or higher than the voltage Vom at the first terminal T1.

Next, the second type upper-lower arm short-circuit will be described hereinafter with reference to FIGS. 3 and 4.

Figure 3:
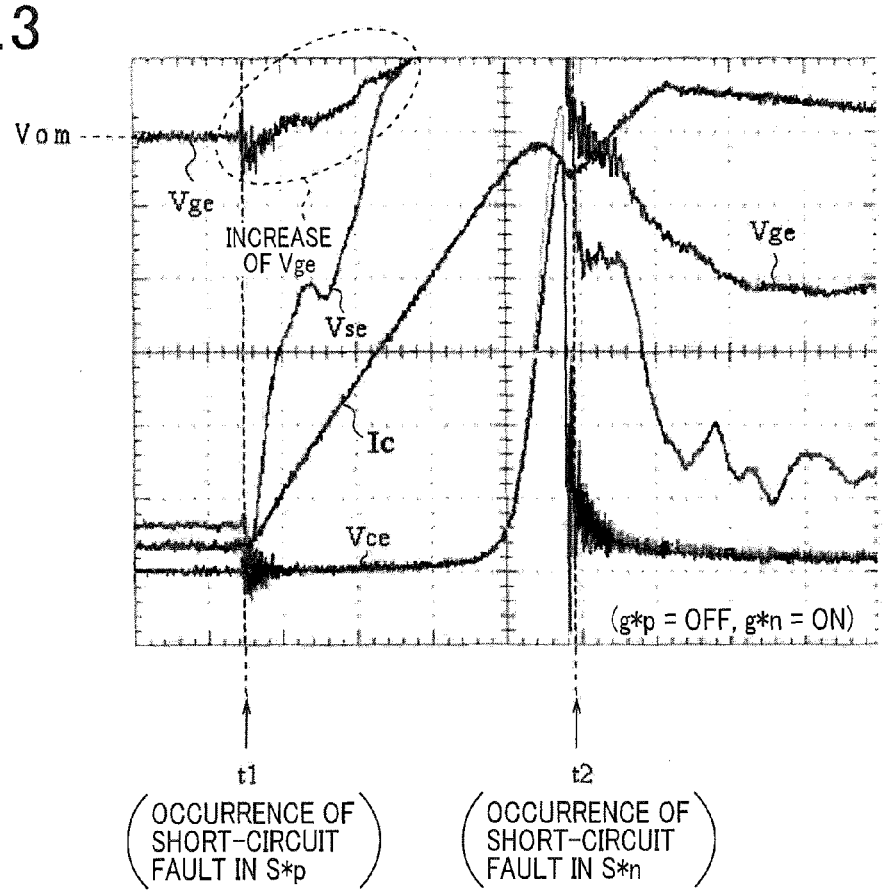
FIG. 3 is a timing chart schematically illustrating how a collector current, a gate voltage Vge, and a sense voltage Vse vary when there is an upper-lower arm short-circuit.
Figure 4:
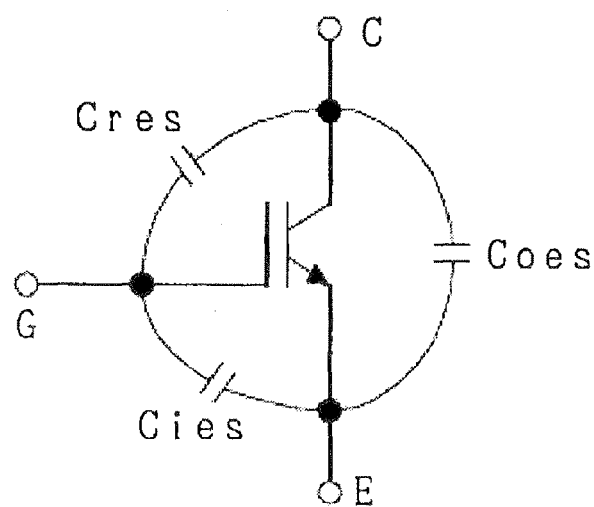
FIG. 4 is a view schematically illustrating a feedback capacitor of an IGBT.

FIG. 3 schematically illustrates how: the gate voltage Vge, the collector current Ic, the collector-emitter voltage Vce, and the sense voltage Vse of a switching element S*# vary while there is a second type upper-lower arm short-circuit, that is, there is a short-circuit fault of the high-side switching element S*p with the corresponding low-side switching element S*n being in the full on state.

As illustrated in FIG. 3, when there is a short-circuit fault in the high-side switching element S*p at time t1, a short-circuit current starts to flow through the high- and low-side switching elements S*p and S*n. The flow of the short-circuit current through the high- and low-side switching elements S*p and S*n increases the collector-emitter voltage Vce of the low-side switching element S*n, resulting in flow of a current from the collector of the low-side switching element S*n into the gate thereof via a feedback capacitor Cres between the gate and collector of the low-side switching element S*n (see FIG. 4). This increases the gate voltage Vge of the low-side switching element S*n. An increase of the gate voltage Vge of the low-side switching element S*n further increases the collector current Ic, resulting a reduction of the reliability of the high- and low-side switching elements S*p and S*n. Note that FIG. 3 shows that a further increase of the collector current Ic causes a short-circuit fault in the low-side switching element S*n at time t2.

In view of such a problem, the drive unit DU for each switching element S*# according to the first embodiment is equipped with the bypass path Lβ and the diode 56. With this configuration, even if there is a short-circuit fault in the high-side switching element S*p at time t11 (see FIG. 5) so that the gate voltage Vge becomes equal to or higher than the sum of the voltage Vom at the first terminal T1 and a forward voltage drop Vf across the diode 56, the bypass path Lβ causes a current to flow from the gate of the switching element S*# to the first and second capacitors 54a and 54b therethrough. In other words, the bypass path causes charge to be supplied from the gate of the switching element S*# to the first and second capacitors 54a and 54b therethrough, so that the first and second capacitors 54a and 54b are charged.

Figure 5:
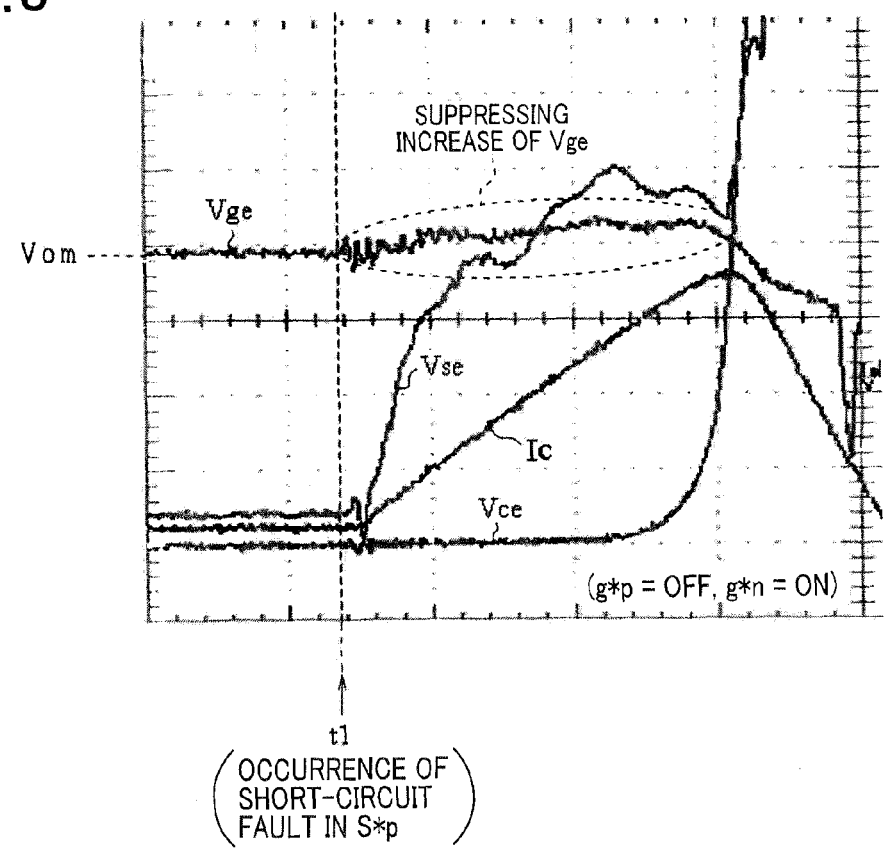
FIG. 5 is a timing chart schematically illustrating the corresponding parameters illustrated in FIG. 3 of a switching element S*#, and showing technical effects based on the location of a diode on a bypass path according to the first embodiment.

This suppresses an increase of the gate voltage Vge of the corresponding low-side switching element S*n (see FIG. 5 corresponding to FIG. 3). Thereafter, because the logical level of the output signal Sig of the comparator 48 has been continuously maintained at the logical high level for the predetermined short-circuit filter time Tsc due to the increase of the sense voltage Vse, execution of the soft-turnoff task forcibly turns off the high- and low-side switching elements S*p and S*n.

As described above, the drive unit DC for each switching element S*# according to the first embodiment is equipped with the bypass path Lβ connecting between the gate of the switching element S*# and the output of the isolated switching power source PS, and the diode 56 is provided on the bypass path Lβ. In addition, the drive unit DC for each switching element S*# is provided with the first and second capacitors 54a and 54b; the first conductive end of each of the first and second capacitors 54a and 54b is electrically connected to a portion of bypass path Lβ between the output of the isolated switching power source PS and the diode 56. The second conductive end of each of the first and second capacitors 54a and 54b, which is opposite to the first conductive end thereof, is electrically connected to the source of the emitter of the switching element S*# via the common potential terminal G.

This configuration of the drive unit DU for each switching element S*# makes it possible to suppress an increase of the gate voltage Vge of the switching element S*# even if there is a second type upper-lower arm short-circuit. This prevents reduction of the reliability of each switching element S*#, particularly, the upper- and lower arm switching elements S*p and S*n corresponding to the second type lower-arm short-circuit.

Particularly, in the first embodiment, the diode 56 serves to prevent flow of a current through the bypass path Lβ from the output of the isolated switching power source PS to the gate of the switching element S*#. This prohibits the gate of the switching element S*# from being charged through the bypass path Lβ while the charging task for the gate of the switching element S*# is being carried out. Thus, it is possible to prevent the charging rate of the gate of the switching element S*# from increasing, thus prohibiting an increase of a surge produced when the switching element S*# is changed from the off state to the on state.

The diode 56, which operates without energization by the drive controller 52, serves to effectively prevent an increase of the gate voltage Vge of the switching element S*# even if there is a second type upper-lower arm short-circuit.

In addition, the drive unit DC for each switching element S*# according to the first embodiment is configured such that the impedance RLβ of the bypass path Lβ is lower than the impedance RLα of the charging path Lα. This configuration reduces a voltage drop through the bypass path Lβ when a current, which has flowed into the gate of the switching element S*# via the feedback capacitor, is flowing through the bypass path Lβ, thus causing a current to easily flow through the bypass path Lβ. For this reason, it is possible to effectively suppress an increase of the gate voltage Vge of the switching element S*# even if there is a second type upper-lower arm short-circuit.

The drive unit DU for each switching element S*# according to the first embodiment is configured such that the bypass path Lβ is located out of the drive IC 26. This configuration prevents a reduction of the reliability of the drive IC 26 due to heat produced by flow of a current through the bypass path Lβ.

Second Embodiment

A control system for controlling the motor-generator 10 according to the second embodiment of the present disclosure will be described with reference to FIGS. 6 and 7.

The structure and/or functions of the control system according to the second embodiment are mainly identical to those of the control system according to the first embodiment except for the following points. So, the different points will be mainly described hereinafter.

Figure 6:
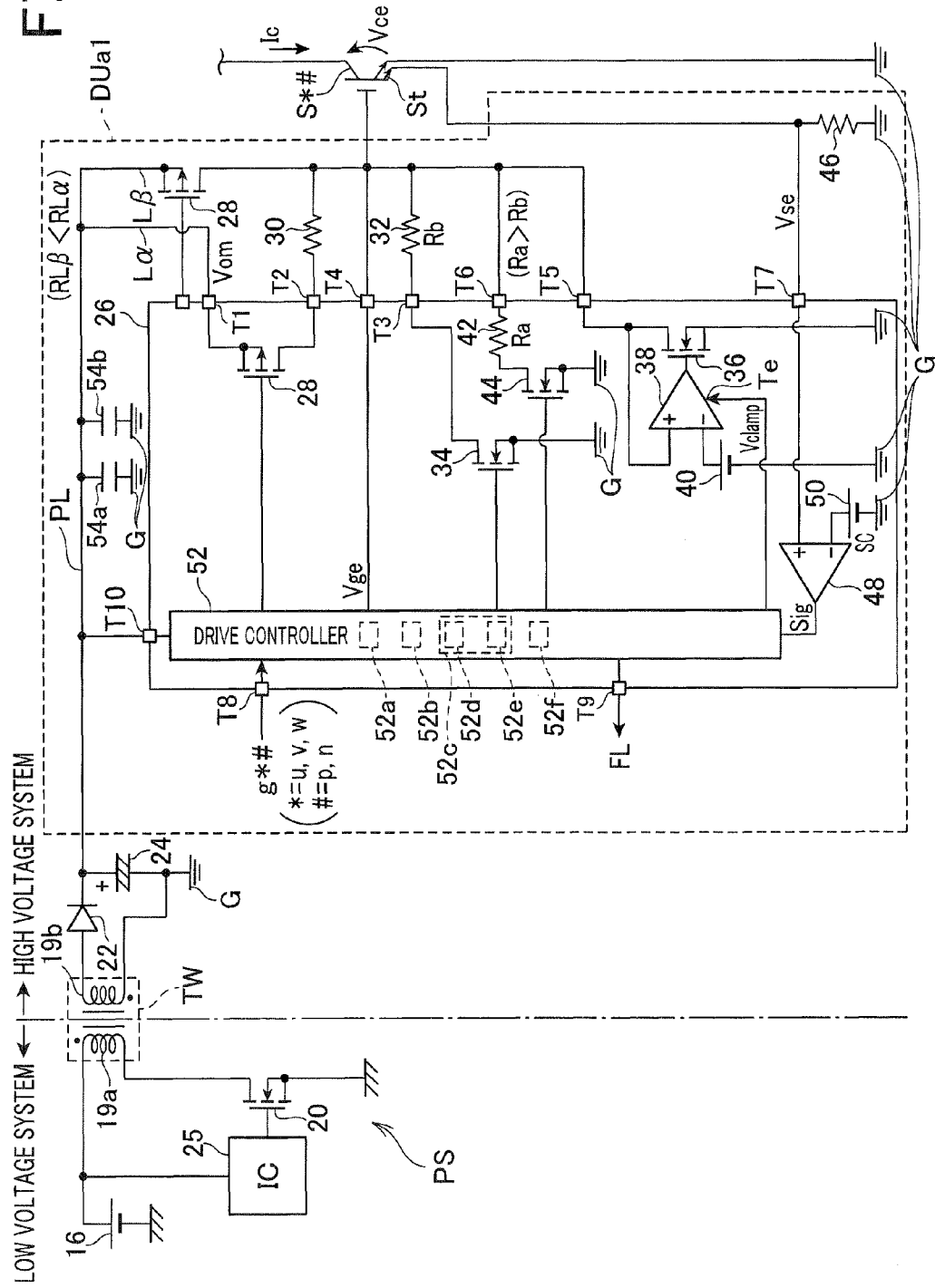
FIG. 6 is a circuit diagram schematically illustrating an example of the structure of each drive unit of the control system according to the second embodiment of the present disclosure.

Referring to FIG. 6, a drive unit DUa1 provided for each switching element S*# according to the second embodiment is equipped with a connection switching element 58, in place of the diode 56, provided on the bypass path Lβ. For example, a P-channel MOSFET is used as the connection switching element 58.

Specifically, the drain of the connection switching element 58 is electrically connected to the gate of the switching element S*# via a corresponding portion of the bypass path Lβ, and the source of the connection switching element 58 is electrically connected to the point of the bypass path Lβ to which the first conductive end of each of the first and second capacitors 54a and 54b is electrically connected. The gate of the connection switching element 58 is electrically connected to the drive controller 52 via an eleventh terminal T11 of the drive IC 26.

The drive controller 52 functionally includes a gate bypass unit 52f for performing a gate bypass task that bypasses the gate of the switching element S*#. The gate bypass unit 52f serves as, for example, a connection controller.

Next, let us describe the gate bypass task carried out by the gate bypass unit 52f.

Next, the gate bypass task will be described hereinafter. The gate bypass task is designed to connect the gate of the switching element S*# to the first and second capacitors 54a and 54b via the bypass path Lβ only when the switching element S*# is in the full on state.

An example of a specific routine for the gate bypass task will be described hereinafter with reference to FIG. 7. Note that the drive controller 52 of each drive unit DU can be configured as a programmed logic unit, a hard-wired logic unit, or the combination of hardwired-logic and programmed-logic hybrid units, and can repeatedly carry out the routine, i.e. the gate bypass routine, every preset cycle as an example.

Figure 7:
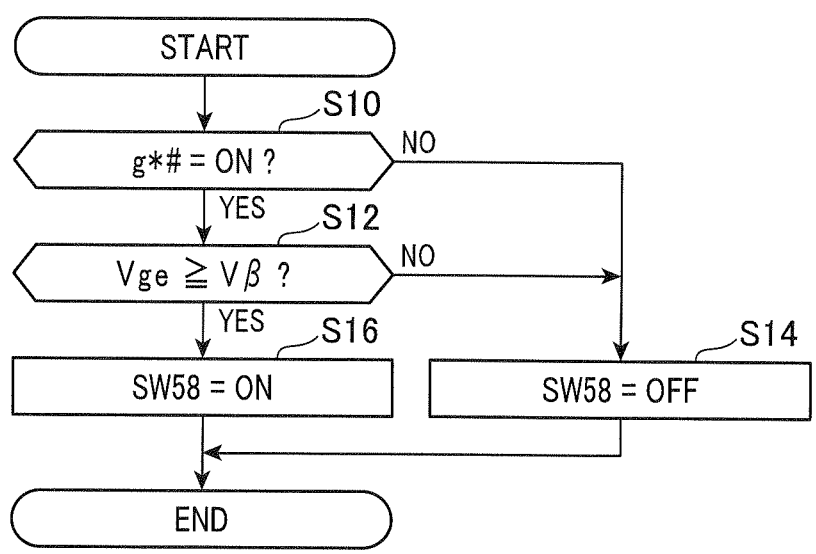
FIG. 7 is a flowchart schematically illustrating an example of a gate bypass routine carried out by each drive unit of the control system illustrated in FIG. 2.

Referring to FIG. 7, when launching the gate bypass routine, the drive controller 52 (gate bypass unit 52f) determines whether the drive signal g*# currently input thereto is in the on command in step S10. Upon determination that the drive signal g*# currently input thereto is in the on command (YES in step S10), the drive controller 52 executes the next operation in step S12 to determine whether the gate voltage Vge is equal to or higher than a preset voltage Vβ. Note that, in the second embodiment, the preset voltage Vβ is set to be slightly lower than the voltage Vom at the first terminal T1. For example, the preset voltage Vβ is set to be a value within the range from 13 to 14 V. The operation in step S12 is to determine whether the switching element S*# is in the full on state.

Upon determination that the gate voltage Vge is lower than the preset voltage Vβ so that the switching element S*# is not in the full on state (NO in step S12), or upon determination that the drive signal g*# currently input thereto is not in the on command (NO in step S10), the drive controller 12 performs the operation in step S14 to turn off or keep off the connection switching element 58. This interrupts electrical connection between the gate of the switching element S*# and each of the first and second capacitors 54a and 54b via the bypass path Lβ, thus opening the bypass path Lβ.

Otherwise, upon determination that the gate voltage Vge is equal to or higher than the preset voltage Vβ so that the switching element S*# is in the full on state (YES in step S12), the drive controller 12 turns on the connection switching element 58 in step S16. This establishes electrical connection between the gate of the switching element S*# and each of the first and second capacitors 54a and 54b via the bypass path Lβ, thus closing the bypass path Lβ.

When terminating the operation in step S14 or S16, the drive controller 12 terminates the gate bypass routine.

As described above, the drive unit DUa1 for each switching element S*# according to the second embodiment has a substantially identical configuration to that of the drive unit DU except for replacement of the diode 56 with the connection switching element 58. Thus, the drive unit DUa1 achieves the same technical effects as those achieved by the drive unit DU.

Particularly, with the configuration of the drive unit DUa1, an on resistance of the connection switching element 58 is lower than a forward voltage drop across a diode. For this reason, in comparison to the configuration of the drive unit DU according to the first embodiment, the configuration of the drive unit DUa1 further reduces an increase of the gate voltage Vge of the switching element S*# when there is a second type upper-lower arm short-circuit.

Third Embodiment

A control system for controlling the motor-generator 10 according to the third embodiment of the present disclosure will be described with reference to FIG. 8.

The structure and/or functions of the control system according to the third embodiment are mainly identical to those of the control system according to the first embodiment except for the following points. So, the different points will be mainly described hereinafter.

Figure 8:
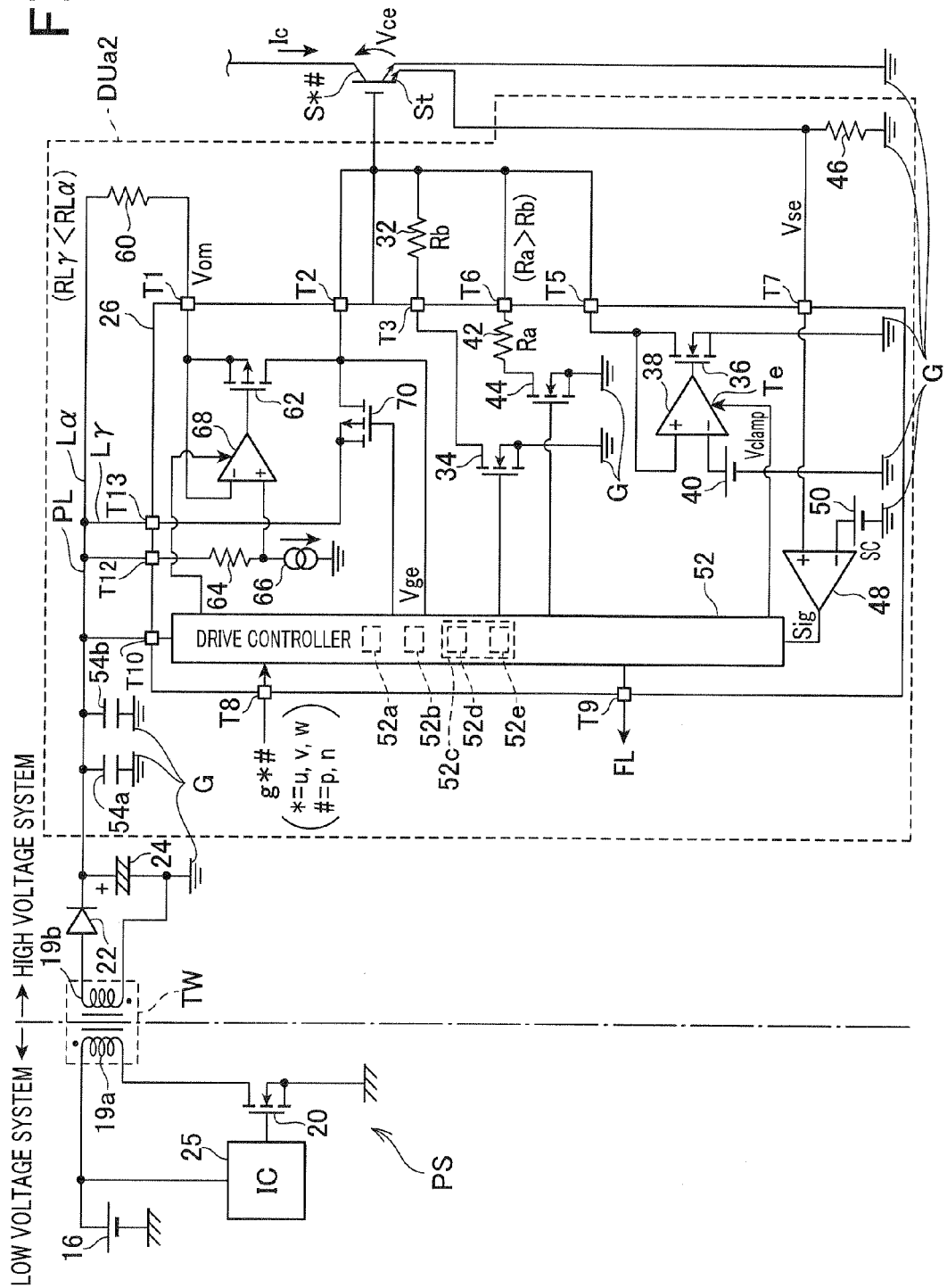
FIG. 8 is a circuit diagram schematically illustrating an example of the structure of each drive unit of the control system according to the third embodiment of the present disclosure.

Referring to FIG. 8, a drive unit DUa2 for each switching element S*# is configured such that a part of a bypass path Lγ according to the third embodiment is provided in the drive IC 26.

Specifically, as illustrated in FIG. 8, the output of the isolated switching power source PS is electrically connected to the first terminal T1 via a charging resistor 60. The first terminal T1 is electrically connected to the gate of the switching element S*# via a charging switching element 62 and the second terminal T2. As the charging switching element 62, a P-channel MOSFET is used. The connection point between the output of the isolated switching power source PS and the charging resistor 60 is electrically connected to one end of a resistor 64 via a twelfth terminal T12 of the drive IC 26. The other end of the resistor 64 is electrically connected to the emitter of the switching element S*# via a constant-current power source 66 and the common potential terminal G. In the third embodiment, an electric path established from the output of the isolated switching power source PS to the gate of the switching element S*# via the charging resistor 60, the first terminal T1, the charging switching element 62, and the second terminal T2 is defined as a charging path Lα according to the third embodiment.

The drive IC 26 is also comprised of a constant-current operational amplifier 68 having a non-inverting input terminal, an inverting input terminal, and an output terminal.

The connection point between the resistor 64 and the constant-current power source 66 is electrically connected to the non-inverting input terminal of the constant-current operational amplifier 68. The inverting input terminal of the constant-current operational amplifier 68 is electrically connected to the first terminal T1, and the output terminal thereof is electrically connected to the charging switching element 62. The constant-current operational amplifier 68 has an enable terminal Te electrically connected to the drive controller 52.

This configuration of the resistor 64, the constant-current power source 66, the constant-current operational amplifier 68, and the first terminal T1 serve as a constant-current control circuit.

Specifically, the constant-current operational amplifier 68 is configured such that the two inputs are virtually short-circuited via the constant-current switching element 62 while the constant-current operational amplifier 68 is operating by an enable signal being input to the enable terminal Te thereof. For this reason, the constant-current operational amplifier 68 is configured to drive the constant-current switching element 62, so that the potential at the first terminal T1 is maintained at a potential at the connection point between the resistor 64 and the constant-current power source 66.

Specifically, when activated, the virtually short-circuited operational amplifier 68 turns on or off the constant-current switching element 62 as a variable resistor, thus matching the potential at the first terminal T1 with the potential at the connection point between the resistor 64 and the constant-current power source 66. This makes it possible to supply a constant charging current to the gate of the switching element S*#.

In addition, in the drive IC 26, the connection point between the charging switching element 62 and the second terminal T2 is electrically connected to the drive controller 52, and the second terminal T2 and a thirteenth terminal T13 of the drive IC 26 is electrically connected to each other via a connection switching element 70. The thirteenth terminal T13 is electrically connected to a portion of the charging path La; the portion is defined between the charging resistor 60 and the output of the isolated switching power source PS.

In the third embodiment, an electric path established from the gate of the switching element S*# to the output of the isolated switching power source PS via the second terminal T2, the connection switching element 70, and the thirteenth terminal T13 is defined as the bypass path Lγ.

The charging resistor 60 provided on the charging path La results in an impedance RLγ of the bypass path Lγ being lower than an impedance RLα of the charging path Lα.

The charging unit 52a of the drive controller 52 performs the charging task that turns off the discharging switching element 34, and outputs the enable signal to the enable terminal Te of the constant-current operational amplifier 68 when the drive signal g*# is changed from the off command to the on command. This makes it possible for the constant-current control circuit to charge the gate of the switching element S*# using the constant current.

In contrast, when the drive signal g*# is changed from the on command to the off command, the discharging unit 52b of the drive controller 52 turns on the discharging switching element 34, and stops the supply of the enable signal to the enable terminal Te of the constant-current operational amplifier 68.

The drive unit DUa2 according to the third embodiment is configured to perform the gate bypass task using the connection switching element 70 in the same procedure as that performed by the drive unit DUa1 according to the second embodiment and illustrated in FIG. 7. Specifically, the drive controller 52 (gate bypass unit 52f) turns on or off the connection switching element 70, thus establishing or non-establishing electrical connection between the gate of the switching element S*# and each of the first and second capacitors 54a and 54b via the bypass path Lγ.

As described above, the drive unit DUa1 for each switching element S*# according to the third embodiment has a substantially identical configuration to that of the drive unit DU except that: how to charge the switching element S*# is different from that according to the first embodiment, and the bypass path Lγ is different from the bypass path Lβ according to the first embodiment.

Thus, the drive unit DUa2 achieves substantially the same technical effects as those achieved by the drive unit DU except for the technical effect based on the location of the bypass path Lβ out of the drive IC 26.

Particularly, with the configuration of the drive unit DUa2, a part of the bypass path Lγ is provided in the drive IC 26. This eliminates the need to provide some elements externally to the drive IC 26. This conserves space in the drive unit DU, and eliminates additional pats and costs required to provide the corresponding elements out of the drive IC 26.

Fourth Embodiment

A control system for controlling the motor-generator 10 according to the fourth embodiment of the present disclosure will be described with reference to FIG. 9.

The structure and/or functions of the control system according to the fourth embodiment are mainly identical to those of the control system according to the first embodiment except for the following points. So, the different points will be mainly described hereinafter.

Figure 9:
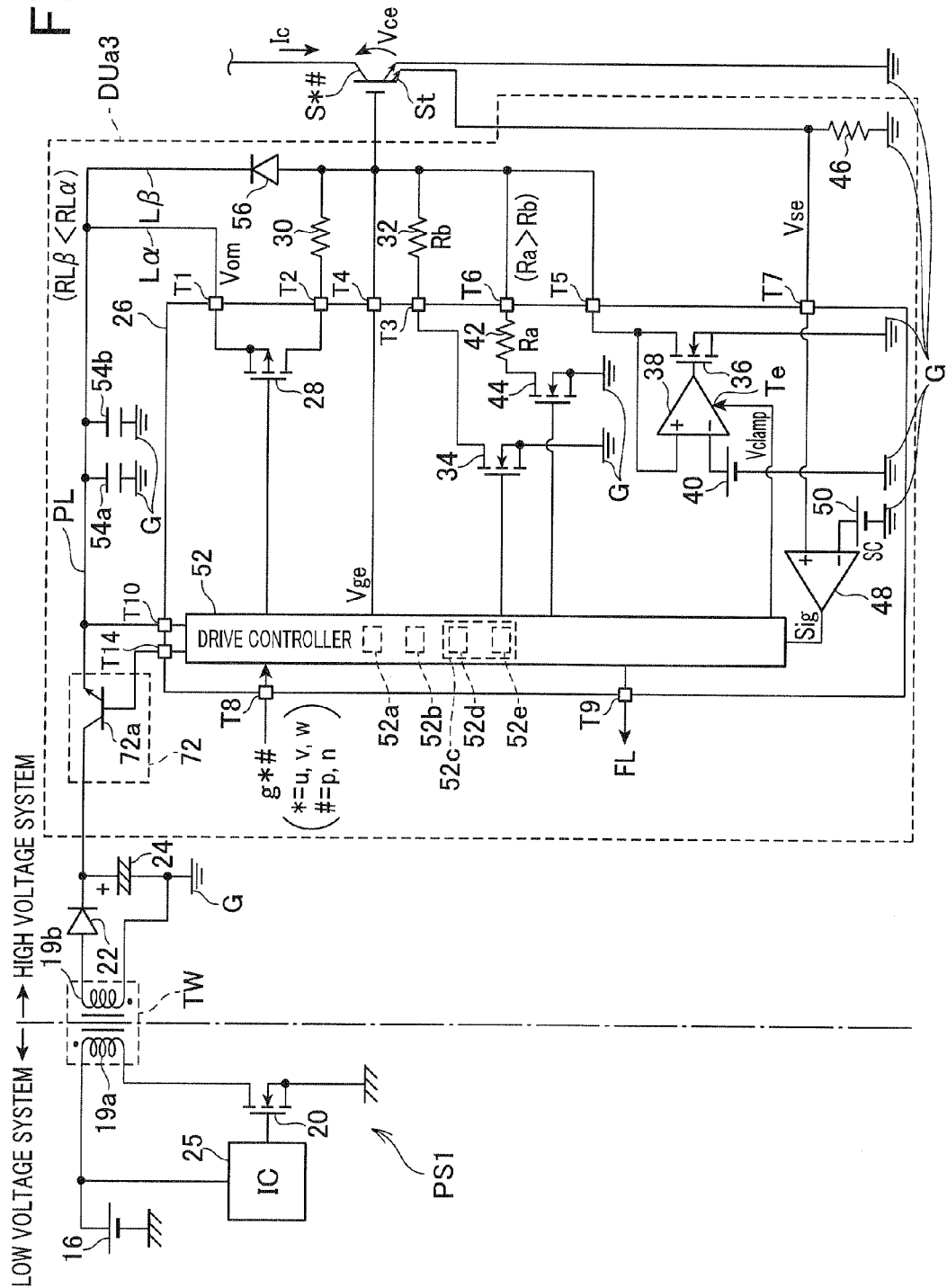
FIG. 9 is a circuit diagram schematically illustrating an example of the structure of each drive unit of the control system according to the fourth embodiment of the present disclosure.

Referring to FIG. 9, a drive unit DUa3 for each switching element S*# is equipped with a series regulator 72 serving as a part of an isolated switching power source PS1. Specifically, the series regulator 72 is comprised of a bipolar transistor 72a. The collector of the bipolar transistor 72a is electrically connected to the connection point between the cathode of the diode 22 and the first conductive end of the capacitor 24, and the emitter of the bipolar transistor 72a is electrically connected to the common power supply line PL of the charging path Lα and the bypass path Lβ. In the fourth embodiment, the collector of the bipolar transistor 72a serves as the output of the isolated switching power source PS1.

The base of the bipolar transistor 72a is electrically connected to the drive controller 52. Specifically, the drive controller 52 is operative to repeatedly turn on or off the bipolar transistor 72a to thereby regulate an output voltage of the isolated switching power supply source PS1 to the target voltage of, for example, 15 V.

Specifically, the drive unit DUa3 for each switching element S*# according to the fourth embodiment has a substantially identical configuration as that of the drive unit DU according to the first embodiment except for the addition of the series regulator 72 thereto. Thus, the drive unit DUa3 achieves the same technical effects as those achieved by the drive unit DU.

Next, additional technical effects achieved by the drive unit DUa3 based on the series regulator 72 will be described hereinafter.

In the first embodiment, the output voltage of the isolated switching power source PS is variable, which results in variation of the gate voltage Vge. An increase of the gate voltage Vge of the switching element S*# when there is a second type upper-lower arm short-circuit might increase a short-circuit current.

In order to address such an issue, in the drive unit DUa3 for each switching element S*# according to the fourth embodiment, the series regulator 72 reduces the variations of the output voltage of the isolated switching power source PS1. For this reason, even if there is a second type upper-lower arm short-circuit, it is possible to limit an increase of the short-circuit current, thus preventing a reduction of the reliability of each switching element S*#, particularly, the upper- and lower arm switching elements S*p and S*n corresponding to the second type lower-arm short-circuit.

Fifth Embodiment

A control system for controlling the motor-generator 10 according to the fifth embodiment of the present disclosure will be described with reference to FIGS. 10 to 12.

The structure and/or functions of the control system according to the fifth embodiment are mainly identical to those of the control system according to the first embodiment except for the following points. So, the different points will be mainly described hereinafter.

A drive unit for each switching element S*# according to the fifth embodiment is specially configured to perform a soft-turn off task including variable setting of the short-circuit filter time Tsc An example of a specific routine for the soft turn-off task will be described hereinafter with reference to FIG. 10. Note that the drive controller 52 (soft turn-off unit 52e) of each drive unit DU can be configured as a programmed logic unit, a hard-wired logic unit, or the combination of hardwired-logic and programmed-logic hybrid units, and can repeatedly carry out the routine, i.e. the soft turn-off routine, every preset cycle as an example.

Figure 10:
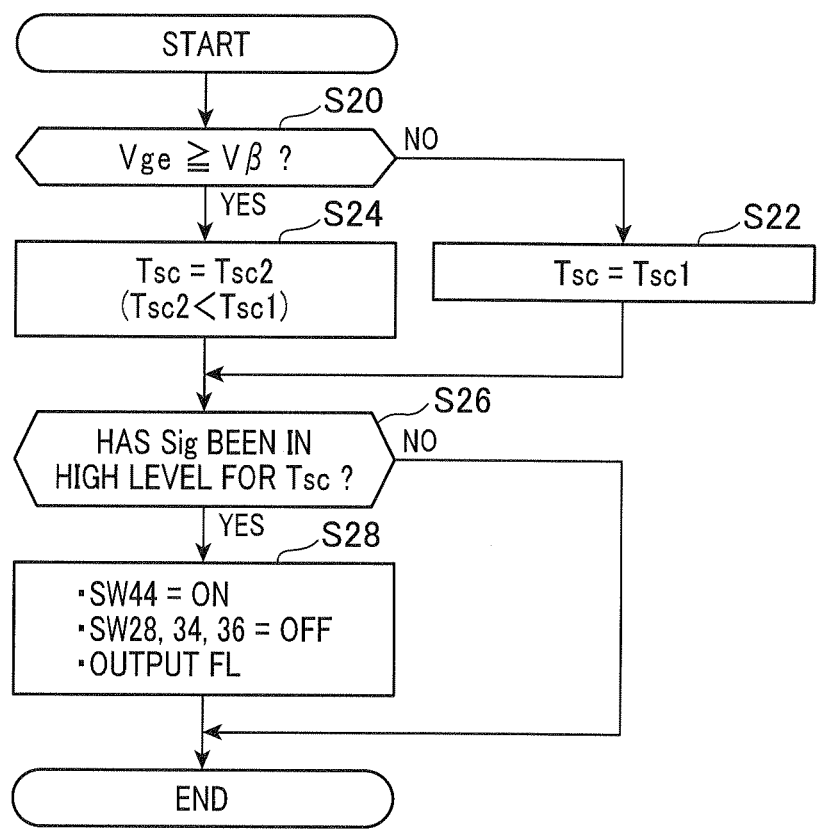
FIG. 10 is a flowchart schematically illustrating an example of a soft turn-off routine carried out by each drive unit of the control system according to the fifth embodiment of the present disclosure.

Referring to FIG. 10, when launching the soft turn-off task, the drive controller 52 determines whether the gate voltage Vge of the switching element S*# is equal to or higher than the preset voltage Vβ in step S20. This operation in step S20 aims to determine whether the switching element S*# is in the full on state.

Upon determination that the gate voltage Vge of the switching element S*# is lower than the preset voltage Vβ (NO in step S20), the drive controller 52 sets the short-circuit filter time Tsc to a first time Tsc1 in step S22.

Otherwise, upon determination that the gate voltage Vge of the switching element S*# is equal to or higher than the preset voltage Vβ (YES in step S20), the drive controller 52 sets the short-circuit filter time Tsc to a second time Tsc2 that is shorter than the first short-circuit filter time Tsc1 in step S24.

After completion of the operation in either step S22 or S24, the drive controller 52 carries out the operation in step S26 to determine whether the output signal Sig of the comparator 48 has been in the logical high level for the short-circuit filter time Tsc.

Upon determination that the output signal Sig of the comparator 48 has been in the logical high level for the short-circuit filter time Tsc (YES in step S26), the drive controller 52 turns on the soft turn-off switching element 44, and turns off each of the discharging switching element 34 and the clamping switching element 36 in step S28. In step S28, the drive controller 52 outputs the fail-safe signal FL to the low-voltage system, i.e. the controller 14, via the terminal T9 and the interface 18. Note that, when performing the operation in step S28, if the clamping task was terminated, the drive controller 52 need not turn off the clamping switching element 36.

Otherwise, when it is determined that the output signal Sig of the comparator 48 has not been in the logical high level for the short-circuit filter time Tsc (NO in step S26), or when the operation in step S28 is completed, the drive controller 52 terminates the soft turn-off task.

Next, let us further describe in detail that the soft turn-off task is performed if there is a first type upper-lower arm short-circuit using FIG. 11

Figure 11A:
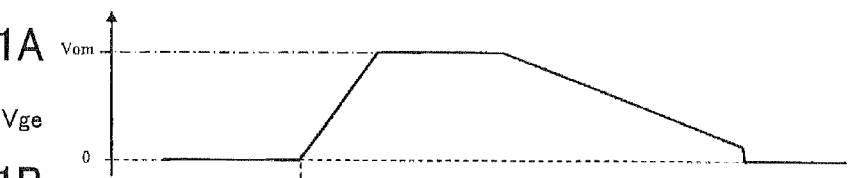
FIGS. 11A to 11C are a joint timing chart schematically illustrating operation of the soft turn-off routine when there is a first type upper-lower arm short-circuit according to the fifth embodiment.
Figure 11B:
Figure 11C:
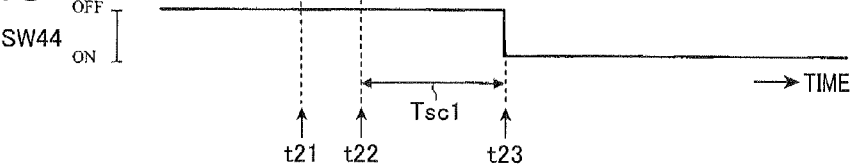

FIGS. 11A to 11C are a joint timing chart schematically illustrating an example of specific operations of the soft turn-off task by the drive controller 52 of the drive unit according to the fifth embodiment when there is a first type upper-lower arm short-circuit.

Specifically, FIG. 11A schematically illustrates an example of how the gate voltage Vge varies, and FIG. 3B schematically illustrates an example of how the sense voltage Vse varies. FIG. 3C schematically illustrates how the soft turn-off switching element 44 is driven.

Referring to FIG. 11, the gate voltage Vge starts to increase at time t21 based on the charging task. This causes the collector current Ic to start to increase, resulting in an increase of the sense voltage Vse.

Thereafter, when it is determined that the gate voltage Vge has reached the short-circuit threshold voltage SC at time t22, the logical level of the output signal Sig from the comparator 48 is determined to be changed to the logical high level. Thereafter, when it is determined that the output signal Sig from the comparator 48 has been in the logical high level for the short-circuit filter time Tsc being set to the first time Tsc1 at time t23, the soft-turn off switching element 44 is switched from the off state to the on state, resulting in the switching element S*# being forcibly turned off.

Next, let us further describe in detail that the soft turn-off task is performed if there is a second type upper-lower arm short-circuit using FIG. 12

Figure 12A:
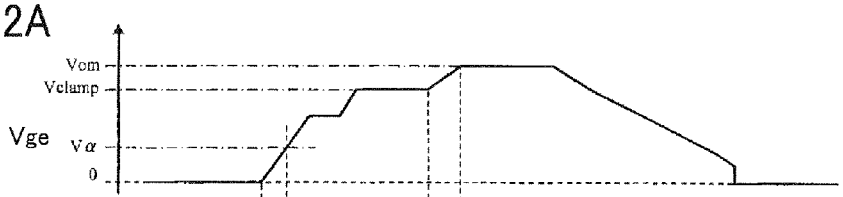
FIGS. 12A to 12C are a joint timing chart schematically illustrating operation of the soft turn-off routine when there is a second type upper-lower arm short-circuit according to the fifth embodiment.
Figure 12B:
Figure 12C:
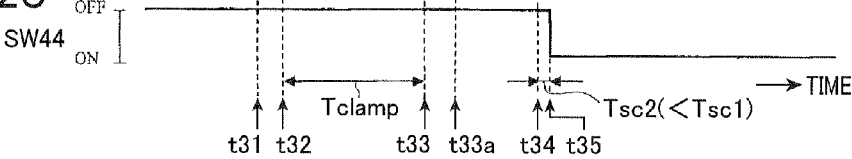

FIGS. 12A to 12C are a joint timing chart schematically illustrating an example of specific operations of the soft turn-off task by the drive controller 52 of the drive unit according to the fifth embodiment when there is a second type upper-lower arm short-circuit. The parameters illustrated in FIGS. 12A to 12C are identical to those illustrated in FIGS. 11A to 11C.

Referring to FIG. 12, the gate voltage Vge starts to increase at time t31 based on the charging task. Thereafter, when it is determined that the gate voltage Vge has reached the predetermined voltage Vα at time t32, the clamping task is started. The clamping task has been performed for the clamp-filter time $T_{clamp}$ since the time t32 up to time t33.

After completion of the clamping task at the time t33, the switching element S*# becomes in the full on state when, for example, the gate voltage Vge becomes equal to the voltage Vom at the first terminal T1 at time t33a.

Thereafter, when it is determined that the gate voltage Vge has reached the short-circuit threshold voltage SC at time t34, the logical level of the output signal Sig from the comparator 48 is determined to be changed to the logical high level. Thereafter, when it is determined that the output signal Sig from the comparator 48 has been in the logical high level for the short-circuit filter time Tsc being set to the second time Tsc2 at time t35, the soft-turn off switching element 44 is switched from the off state to the on state, resulting in the switching element S*# being forcibly turned off.

As described above, the drive unit for each switching element S*# according to the fifth embodiment has a substantially identical configuration to that of the drive unit DU except that the soft turn-off task according to the fifth embodiment is different from that according to the first embodiment.

Thus, the drive unit achieves substantially the same technical effects as those achieved by the drive unit DU.

Particularly, the drive unit DU according to the fifth embodiment is configured to reduce the short-circuit filter time Tsc from the first time Tsc1 to the second time Tsc2 when the switching element S*# is in the full on state. This configuration turns off the switching element S*# as immediate as possible after a short-circuit current is detected, thus further effectively preventing a reduction of the reliability of the switching element S*#.

Each of the first to fifth embodiments of the present disclosure can be modified as described hereinafter.

How to drive the connection switching element 58, serving as, for example, a connection switching element according to the present disclosure, is not limited to the method described in the second embodiment. Specifically, the gate bypass unit 52f can be configured to turn on the connection switching element 58 after a preset time has elapsed since the drive signal g*# input to the drive controller 52 was changed from the off command to the on command.

In each of the second and third embodiments, an MOS FET is used as a connection switching element, but a bipolar transistor can be used.

In each of the first to fifth embodiments, the sense terminal St and the sense resistor 46 serve as, for example, a measuring unit, but the present disclosure is not limited thereto. Specifically, for example, a voltage measuring unit, such as a voltage sensor, for measuring the collector-emitter voltage of a switching element S*# can be installed in each drive unit DU. This makes it possible to measure the collector current based on the measured collector-emitter voltage of the switching element S*#.

In the first embodiment, the diode 56 is used as a rectifier, but another electric element, having functions substantially identical to those of a diode, can be used as a rectifier.

In each of the first to fifth embodiment, as the reference point of each switching element S*# to which the first conductive end of the storage is electrically connected, the emitter of the switching element S*# is used, but the present disclosure is not limited thereto. Specifically, a point of the switching element S*#, which has a potential higher than the voltage Vom at the first terminal T1 corresponding to the output voltage of the isolated switching power source, can be used as the reference point. In this modification, a stabilized potential difference between the first and second conductive terminals of the storage based on the stabilized reference voltage can reduce an increase of the gate voltage Vge even if there is a second type upper-lower arm short-circuit.

The number of storages, such as capacitors, electrically connected to the bypass path is not limited two, and can be set to another. As the storage of the present disclosure, one or more capacitors can be used, but another device capable of storing therein charge and having function basically identical to those of a capacitor can be used.

In each of the first to fifth embodiments, a MOSFET can be used as a switching element S*# of each drive unit DU.

In each of the first to fifth embodiments, the drive units DU are applied to an inverter IV installed in motor vehicles, but the present disclosure is not limited to the application. Specifically, the drive units DU can be applied to a power converter for driving another machine, such as a compressor for air-conditioning, and also can be applied to another device except for such power converters.

While illustrative embodiments of the present disclosure have been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A driver for a target switching element, the driver comprising:
    a charging path, connecting an on-off control terminal of a target switching element and a driving power source, for charging the on-off control terminal of the target switching element;
    a bypass path connecting the on-off control terminal of the target switching element and the driving power source;
    a storage means having one end connected to the bypass path and the other end connected to a portion of the driving power source, the storage means being configured to store therein charge, the portion of the driving power source having a reference potential different from an output potential of the driving power source;
    a connection switching element provided on the bypass path and configured to turn on or off the bypath path;
    a connection driving means that turns on the connection switching element when the target switching element is in a full on state; and
    a charge-discharge driving means that:
        performs a charging task that charges the on-off control terminal via the charging path to switch the target switching element to be in the fill on state upon determining that a drive signal for driving the target switching element is turned to an on command; and
        performs a discharging task that discharges the on-off control terminal to switch the target switching element to be in an off state upon determining that the drive signal is turned to an off command,
    wherein the connection driving means is configured to:
        turn on the connection switching element when determining that the drive signal is the on command and the target switching element is in the full on state; and
        turn off the connection switching element when determining that the drive signal is the off command or determining that the drive signal is the on command and the target switching element is not in the full on state.

2. The driver for a target switching element according to claim 1, wherein an impedance of the bypass path is set to be lower than an impedance of the charging path.

3. The driver for a target switching element according to claim 1, further comprising:
    a charging switching element provided on the charging path and configured to turn on or off the charging path;
    a charging control means that controls the charging switching element; and
    an integrated circuit including the charging switching element and the charging control means,
    wherein the bypass path is provided out of the integrated circuit.

4. The driver for a target switching element according to claim 1, further comprising:
    a charging switching element provided on the charging path and configured to turn on or off the charging path;
    a charging control means that controls the charging switching element; and
    an integrated circuit including the charging switching element and the charging control means,
    wherein a part of the bypass path is provided in the integrated circuit.

5. The driver for a target switching element according to claim 1, wherein the driving power source further comprises a series regulator.

6. The driver for a target switching element according to claim 1, further comprising:
    a current measuring means that measures a current flowing through the input and output terminals of the target switching element; and
    a forcible turn-off means that forcibly turns off the target switching element when the current measured by the current measuring means has been higher than a threshold for a preset threshold time,
    wherein the forcible turn-off means is configured to reduce the preset threshold time when the target switching element is in the full on state.

7. The driver for a target switching element according to claim 1, wherein the target switching element comprises a series-connection element of a high-side switching element and a low-side switching element; the high- and low-side switching elements being connected in parallel to a DC power source.

* * * * *